(12) United States Patent
Fanelli et al.

(10) Patent No.: US 10,134,837 B1
(45) Date of Patent: Nov. 20, 2018

(54) POROUS SILICON POST PROCESSING

(71) Applicant: QUALCOMM Incorporated, San Diego, CA (US)

(72) Inventors: Stephen Alan Fanelli, San Marcos, CA (US); Richard Hammond, Stoke-on-Trent (GB)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/638,874

(22) Filed: Jun. 30, 2017

(51) Int. Cl.
*H01L 29/06* (2006.01)
*H01L 21/265* (2006.01)
*H01L 21/3063* (2006.01)
*H01L 21/762* (2006.01)

(52) U.S. Cl.
CPC ........ *H01L 29/0649* (2013.01); *H01L 21/265* (2013.01); *H01L 21/3063* (2013.01); *H01L 21/76256* (2013.01)

(58) Field of Classification Search
CPC ........... H01L 29/0649; H01L 21/76256; H01L 21/265; H01L 21/3063
See application file for complete search history.

(56) References Cited

U.S. PATENT DOCUMENTS

| | | | |
|---|---|---|---|
| 5,240,883 A | 8/1993 | Abe et al. | |
| 5,906,708 A | 5/1999 | Robinson et al. | |
| 6,331,467 B1 * | 12/2001 | Brown | H01L 29/66348 257/E21.384 |
| 6,407,441 B1 | 6/2002 | Yuan | |
| 7,811,382 B2 * | 10/2010 | Sadaka | C30B 25/02 117/101 |
| 8,471,340 B2 | 6/2013 | Botula et al. | |
| 8,809,156 B1 * | 8/2014 | Allen | H01L 29/73 438/309 |
| 9,515,139 B2 | 12/2016 | Arriagada et al. | |
| 2004/0140479 A1 * | 7/2004 | Akatsu | C30B 29/60 257/190 |
| 2004/0245571 A1 | 12/2004 | Cheng et al. | |
| 2005/0014346 A1 * | 1/2005 | Mitani | H01L 21/76254 438/459 |
| 2009/0124038 A1 * | 5/2009 | Tuttle | H01L 27/14643 438/70 |
| 2010/0176453 A1 * | 7/2010 | Dennard | H01L 21/76254 257/368 |
| 2011/0084314 A1 * | 4/2011 | Or-Bach | G03F 9/7076 257/209 |

(Continued)

FOREIGN PATENT DOCUMENTS

WO 2016016532 A1 2/2016
WO 2018044494 A1 3/2018

OTHER PUBLICATIONS

International Search Report and Written Opinion—PCT/US2018/028912—ISA/EPO—Jul. 17, 2018.

*Primary Examiner* — Jarrett J Stark
(74) *Attorney, Agent, or Firm* — Seyfarth Shaw LLP

(57) ABSTRACT

A semiconductor on insulator (SOI) device may include a semiconductor handle substrate. The semiconductor hand may include a porous semiconductor layer, and an etch stop layer proximate the porous semiconductor layer. The SOI may also include an insulator layer on the etch stop layer. The SOI may further include a device semiconductor layer on the insulator layer.

13 Claims, 11 Drawing Sheets

(56) References Cited

U.S. PATENT DOCUMENTS

| | | | |
|---|---|---|---|
| 2011/0121366 A1* | 5/2011 | Or-Bach | H01L 21/6835 257/204 |
| 2014/0367786 A1* | 12/2014 | Bedell | H01L 27/1203 257/369 |
| 2016/0071760 A1 | 3/2016 | Liu | |
| 2017/0062284 A1* | 3/2017 | Mason | H01L 21/84 |

* cited by examiner

POROUS SILICON POST PROCESSING

BACKGROUND

Field

The present disclosure generally relates to integrated circuits (ICs). More specifically, the present disclosure relates to porous silicon processing.

Background

One goal driving the wireless communication industry is providing consumers with increased bandwidth. The use of carrier aggregation in current generation communications provides one possible solution for achieving this goal. Carrier aggregation enables a wireless carrier to increase bandwidth by simultaneously using multiple frequencies for a single communication stream. While an increased amount of data is provided to the end user, carrier aggregation implementation is complicated by noise created at the harmonic frequencies due to the frequencies used for data transmission. For example, 700 MHz transmissions may create harmonics at 2.1 GHz, which interfere with data broadcast at 2 GHz frequencies.

The design complexity of mobile radio frequency (RF) chips (e.g., mobile RF transceivers) is complicated by added circuit functions to support communication enhancements, such as carrier aggregation. The design of these mobile RF transceivers may include the use of semiconductor on insulator technology. Semiconductor on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce artificial harmonics caused by the proximity of an active device on the silicon layer and a substrate supporting the BOX layer.

For example, high performance complementary metal oxide semiconductor (CMOS) radio frequency (RF) switch technologies are currently manufactured using SOI substrates. While SOI substrates may provide some protection against artificial harmonics in RF transceivers that support carrier aggregation, there is a need for increasing device isolation and reducing RF loss. For example, a CMOS switch device may be physically bonded to a high resistivity (HR) handle wafer, such as HR-silicon or sapphire. The increased spatial separation of the switch device from the underlying substrate dramatically improves the RF performance of the CMOS switch. Unfortunately the use of SOI wafers and handle substrates is quite expensive relative to the cost of a bulk semiconductor wafer.

SUMMARY

A semiconductor on insulator (SOI) device may include a semiconductor handle substrate. The semiconductor hand may include a porous semiconductor layer, and an etch stop layer proximate the porous semiconductor layer. The SOI may also include an insulator layer on the etch stop layer. The SOI may further include a device semiconductor layer on the insulator layer.

A method of fabricating a semiconductor on insulator (SOI) device may include fabricating an etch stop layer between an insulator layer and a semiconductor handle substrate of the SOI device. The method may also include fabricating an active device in a device semiconductor layer on a front-side surface of the insulator layer. The method may further include etching a backside of the semiconductor handle substrate and stopping on the etch stop layer to form a porous silicon layer of the semiconductor handle substrate.

A semiconductor on insulator (SOI) device may include an insulator layer having a backside surface on a semiconductor handle substrate. The SOI may also include a device semiconductor layer on a front-side surface of the insulator layer. The SOI may further include the semiconductor handle substrate including an etch stop layer proximate the insulator layer, the semiconductor handle substrate comprising means for reducing radio frequency (RF) harmonics contacting the etch stop layer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

Figure 1:
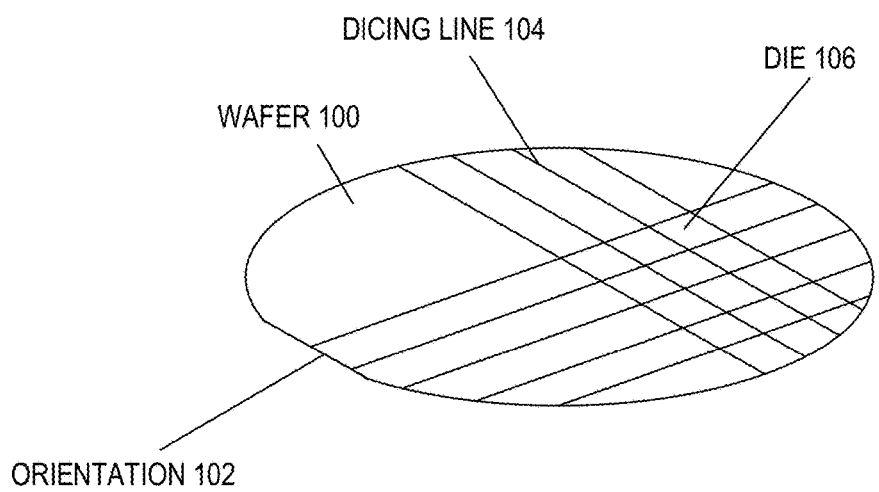
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. While an increased amount of data is provided to the end user, carrier aggregation implementation is complicated by noise created at the harmonic frequencies due to the frequencies used for data transmission.

The design complexity of mobile radio frequency (RF) chips (e.g., mobile RF transceivers) is complicated by added circuit functions to support communication enhancements, such as carrier aggregation. The design of these mobile RF transceivers may include the use of semiconductor on insulator technology. Semiconductor on insulator (SOI) technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce artificial harmonics caused by the proximity of an active device on the silicon layer and a substrate supporting the BOX layer.

High performance complementary metal oxide semiconductor (CMOS) radio frequency (RF) switch technologies are manufactured using SOI substrates. To increase device isolation and reduce RF losses (e.g., due to artificial harmonics), such switch devices may then be physically bonded to a high resistivity (HR) handle wafer, such as HR-silicon or sapphire. The increased spatial separation of the switch device from the underlying substrate dramatically improves the RF performance of the CMOS switch. Unfortunately the use of SOI wafers including, for example, a trap rich layer, is quite expensive relative to the cost of a bulk semiconductor wafer.

Various aspects of the disclosure provide techniques for forming an etch stop layer proximate an insulator layer of a bulk semiconductor handle wafer. The etch stop layer prevents etching of the bulk semiconductor handle wafer. The etch stop layer may also function as a trap rich layer (TRL), and reduces harmonics of an RF device and increases linearity significantly relative to current techniques. For example, a circuit may be fabricated on a wafer (e.g., a CMOS wafer), and a backside of the wafer may be etched up to the etch stop layer to form porous silicon. The conversion of the semiconductor handle substrate to porous silicon results in a significant improvement of CMOS RF switch harmonics.

Porous silicon is relatively inexpensive to produce. In particular, porous silicon can be fabricated by introducing a silicon wafer to an electro-chemical etch in dilute hydrofluoric acid. A bulk semiconductor handle wafer may be subjected to, for example, an electro-chemical etch process to form porous silicon within a surface of the bulk semiconductor handle wafer. The degree of porosity of the porous silicon may be controlled by a current density, a concentration of the acid, and a duration of the etch. Cost is reduced when porous silicon is formed in the bulk semiconductor handle wafer in place of a conventional, trap rich silicon handle wafer.

It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably unless such interchanging would tax credulity.

Various aspects of the disclosure provide techniques for creating an etch stop layer proximate an insulator (e.g., BOX) layer of a SOI device. The SOI device initially includes a bulk semiconductor handle wafer. The etch stop layer may allow complete conversion of a backside of a processed bulk semiconductor handle wafer into a porous semiconductor layer. In aspects of the present disclosure, a porous silicon handle wafer functions as a trap rich layer without having to use a conventional trap rich silicon handle wafer, which is twice the cost of a bulk silicon wafer. The etch stop layer may also function as a trap rich layer (TRL) for radio frequency (RF) integrated circuits.

A bulk semiconductor handle wafer may be a uniformly doped P-type or N-type substrate, rather than an implanted substrate. An advantage of uniform doping over implanting is that uniform doping results in uniformity of pores in a porous silicon layer (e.g., porous layer). This pore uniformity enables the porous silicon layer to have a depth greater than a predetermined isolation depth (e.g., 10 microns), which directly relates to the effective resistivity of the porous silicon layer. In the case of RF signals, the porous silicon layer should be deep enough (e.g., >10 microns) to fully isolate the active device while also allowing for application of RF switches by providing an increased resistivity. In aspects of the present disclosure, a bulk semiconductor handle wafer may be porous throughout a majority of its thickness to break up effects from a parasitic resistance channel of any associated RF circuits.

In accordance with aspects of the present disclosure, ion implantation of an etch stop material is performed beneath an insulator layer (e.g., a buried oxide (BOX) layer) of an SOI device and into a handle semiconductor substrate of the SOI device. Once the etch stop layer is formed, a front-end-of-line (FEOL) process creates active devices (e.g., an RF switch device) in a device semiconductor layer of the SOI device. After the FEOL process is complete, an exposed backside of the semiconductor handle substrate undergoes conversion to porous silicon by exposure to a single cell, electrolyzing bath of hydrofluoric (HF) acid. For example, a bulk semiconductor wafer (e.g., a bulk silicon (Si) wafer) may be subjected to an electro-chemical etch process to form porous silicon.

In one aspect of the present disclosure, porous silicon is formed throughout the handle semiconductor substrate until the porous etch stop is encountered. The etch stop layer protects the porous silicon formation from affecting the insulator layer or the semiconductor device layer. In addition, the etch stop layer may function as a trap rich layer. The porous silicon reduces harmonics of an RF device and increases linearity significantly relative to current techniques. The conversion of the entire semiconductor handle substrate to porous silicon results in a significant improvement of CMOS RF switch harmonics.

Advantageously, the etch stop layer also functions as a trap rich layer without using a conventional trap rich silicon handle wafer, which may be twice the cost of a bulk silicon wafer. In one configuration, the etch stop layer may be implanted on a front-side surface of a semiconductor device substrate. An insulator layer (e.g., a buried oxide (BOX) layer) may be supported by the substrate. A device layer may further be supported by the BOX layer. The device semiconductor layer may be composed of an epitaxially grown silicon layer that is in a range of 150 to 750 angstroms. The substrate may be 200 microns, with a 50 micron porous layer, in one configuration.

FIG. 1 illustrates a perspective view of a wafer. A wafer 100 may be a semiconductor wafer, SOI wafer, or may be a substrate material with one or more layers of material on a surface of the wafer 100. The wafer 100 may be a compound material, such as gallium arsenide (GaAs) or gallium nitride (GaN), a ternary material such as indium gallium arsenide (InGaAs), quaternary materials, silicon, quartz, glass, or any material that can be a substrate material. Although many of the materials may be crystalline in nature, polycrystalline or amorphous materials may also be used for the wafer 100. For example, various options for the substrate include a glass substrate, a semiconductor substrate, a core laminate substrate, a coreless substrate, a printed circuit board (PCB) substrate, or other like substrates.

The wafer 100, or layers that are coupled to the wafer 100, may be supplied with materials that enable formation of different types of electronic devices in or on the wafer 100. In addition, the wafer 100 may have an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100, assuming a semiconductor wafer.

Once the wafer 100 has been processed as desired, the wafer 100 is divided up along dicing lines 104. For example, once fabrication of integrated circuits on the wafer 100 is complete, the wafer 100 is divided up along the dicing lines 104, which may be referred to as "dicing streets." The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form the die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Figure 3:
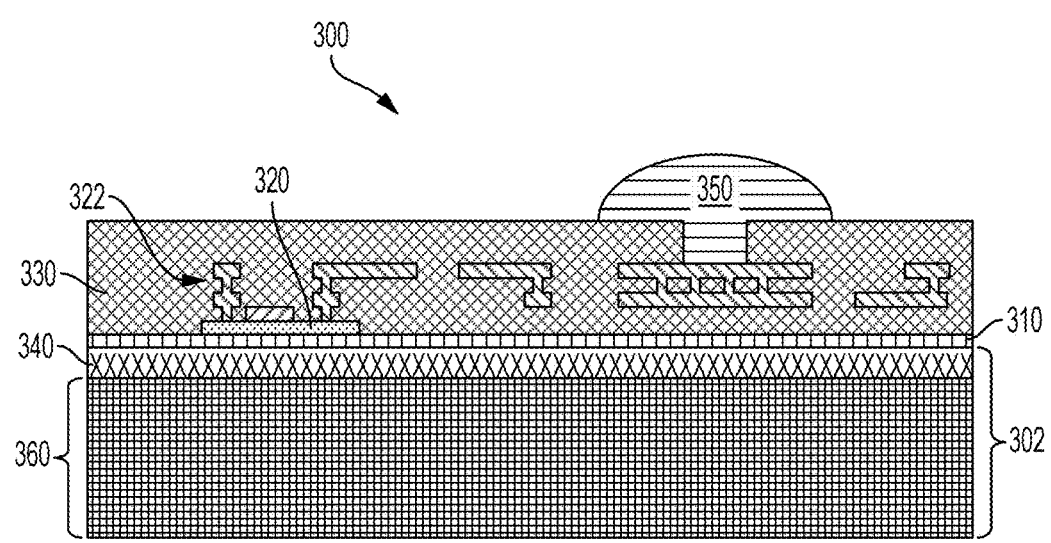
FIG. 3 illustrates a cross-sectional view of a semiconductor on insulator (SOI) device including an etch stop layer according to aspects of the present disclosure.
Figure 5:
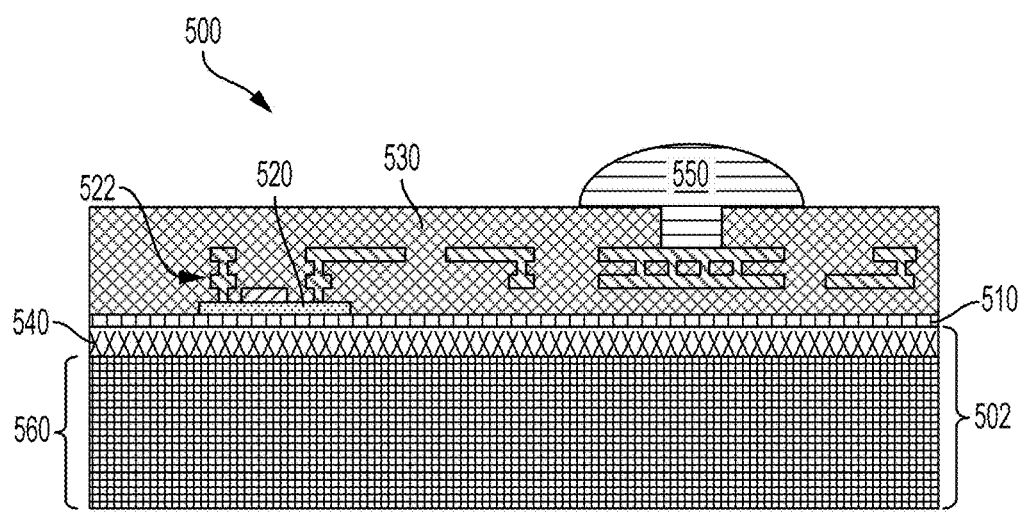
FIG. 5 illustrates a semiconductor on insulator (SOI) device including an etch stop layer according to aspects of the present disclosure.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package. The wafer 100, may be used as a handle substrate including an etch stop layer for forming a porous silicon layer, for example, as shown in FIGS. 3 and 5.

Figure 2:
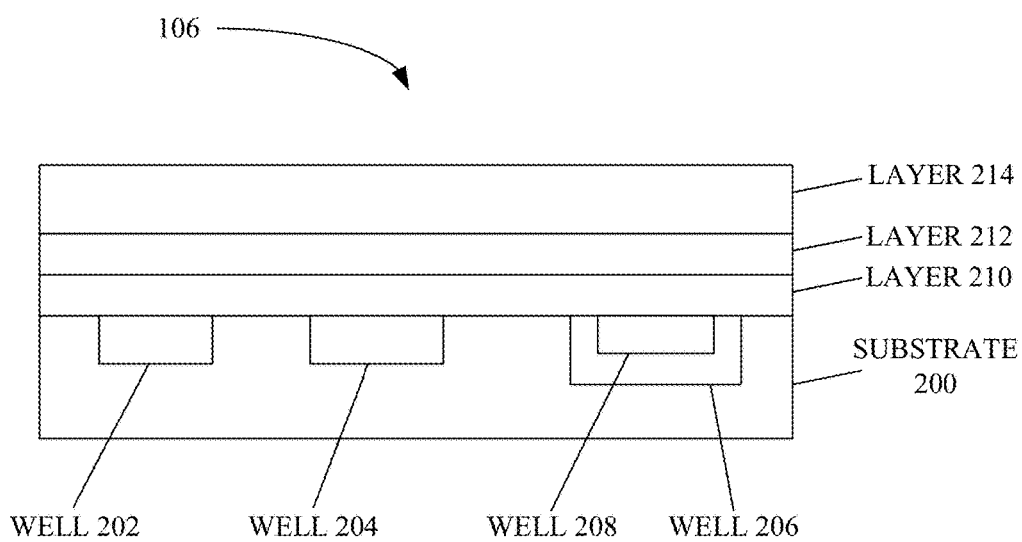
FIG. 2 illustrates a cross-sectional view of a die.

FIG. 2 illustrates a cross-sectional view of a die 106. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200. Alternatively, the substrate may be a semi-insulating substrate, including compound semiconductor transistors.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT), a heterojunction bipolar transistor (HBT), or other like compound semiconductor transistor. The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods.

Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Figure 8:
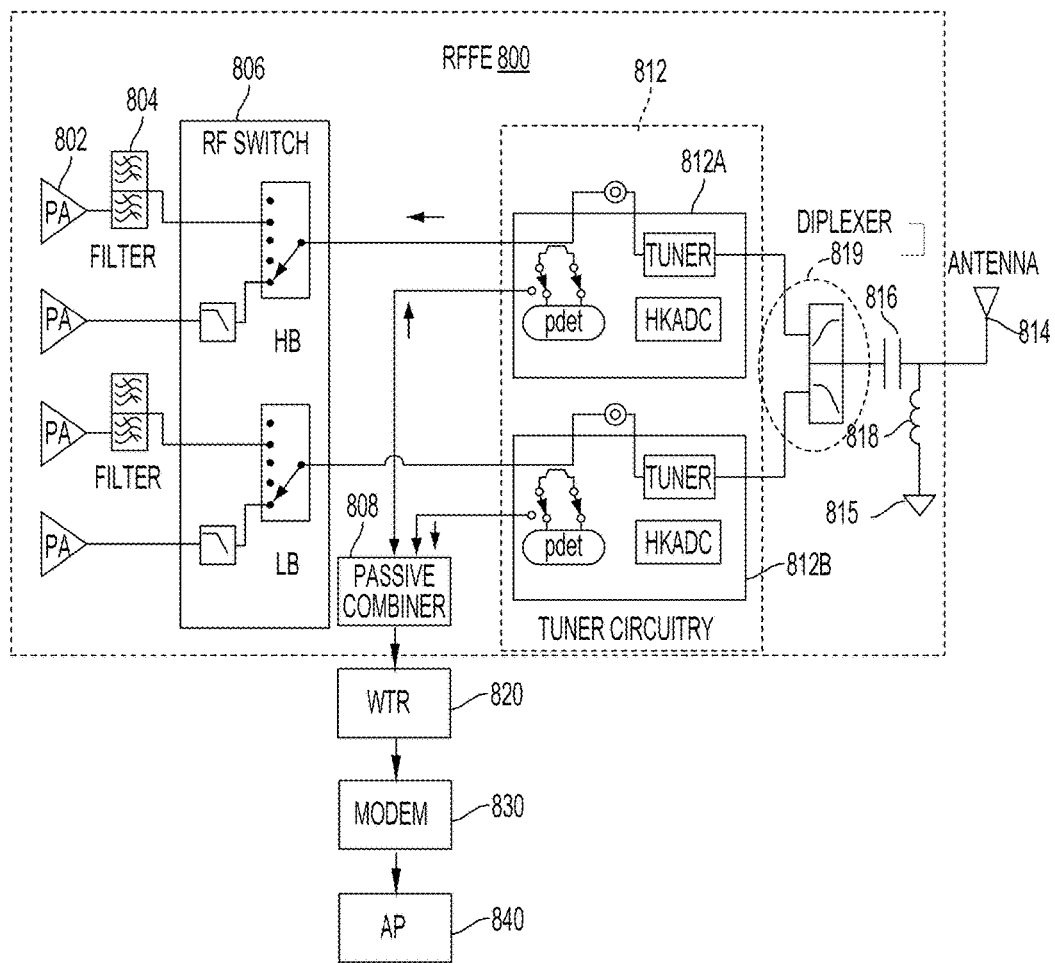
FIG. 8 is a schematic diagram of a radio frequency (RF) front end (RFFE) module employing RF chips having a semiconductor handle substrate including an etch stop layer according to an aspect of the present disclosure.
Figure 9:
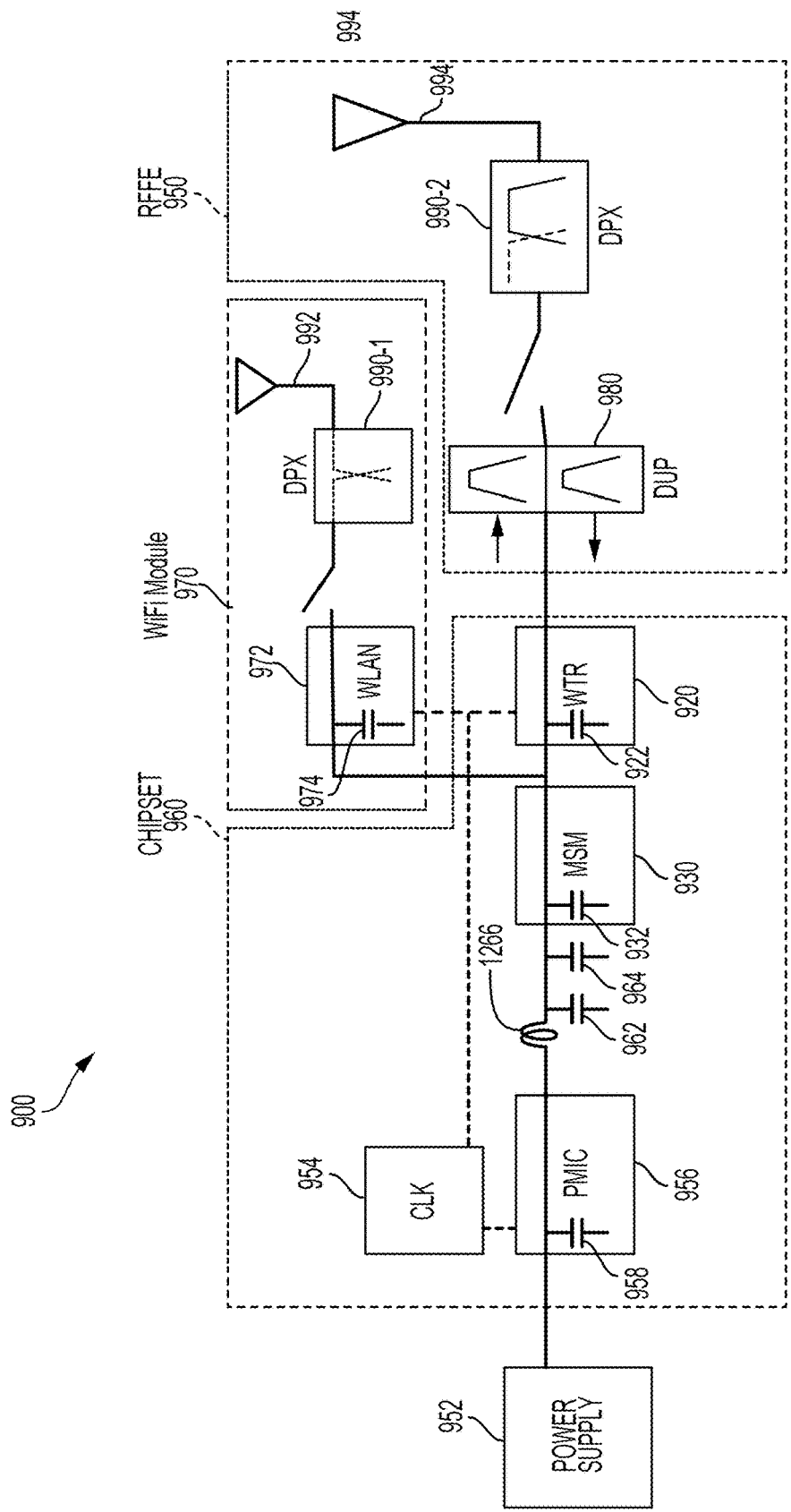
FIG. 9 is a schematic diagram of a WiFi module and a radio frequency (RF) front end (RFFE) module employing RF chips including a semiconductor handle substrate having an etch stop layer for a chipset to enable carrier aggregation according to aspects of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure. Aspects of the present disclosure provide RF chips including a handle substrate having an etch stop layer for forming a porous silicon layer. These RF chips on the semiconductor handle substrates may also include filters, diplexers, a triplexers, low pass filters, and/or a notch filter, or other like circuit elements useful in the formation of radio frequency (RF) front end modules, for example, as shown in FIGS. 8 and 9.

Various aspects of the disclosure provide techniques for ion implanting an etch stop layer in a semiconductor handle substrate of a semiconductor on insulator (SOI) device. For example, the etch stop layer may be formed proximate (e.g., below) an insulator layer (e.g., BOX layer) of the SOI device. Once formed, a circuit may be fabricated in a device semiconductor layer supported by the semiconductor handle substrate having the etch stop layer. Subsequently, a backside of the semiconductor handle substrate is converted to porous silicon through a hydrofluoric (HF) acid etch that stops on the etch stop layer. The etch stop layer prevents the etch from damaging the device semiconductor layer. Additionally, the etch stop layer and the backside porous silicon layer of the semiconductor handle substrate may reduce harmonics of an RF device. For example, the etch stop layer and the backside porous silicon layer of the semiconductor handle substrate may reduce harmonics of the RF device, while significantly increases linearity relative to current techniques.

FIG. 3 illustrates a semiconductor on insulator (SOI) device 300 including a semiconductor handle substrate 302 having an etch stop layer 340 according to aspects of the present disclosure. The semiconductor handle substrate 302 (e.g., a bulk semiconductor handle wafer or SOI wafer) may also include a porous silicon layer 360 (e.g., a porous semiconductor layer). The etch stop layer 340 may have various depths in relation to a thickness of the semiconductor handle substrate 302. For example, the semiconductor handle substrate 302 may have a thickness of 50 microns, and the etch stop layer 340 may be 10 microns deep. Of course, various other thicknesses for the semiconductor handle substrate 302 and depths of the etch stop layer 340 are possible. According to various aspects of the present disclosure, the porous silicon layer 360 extends from a backside of the semiconductor handle substrate 302 and stops at the etch stop layer 340.

According to an aspect of the present disclosure, the etch stop layer 340 may be ion-implanted in a front-side surface of the semiconductor handle substrate 302. For example, the ion implant may be implanted germanium. Alternatively, the etch stop layer 340 may be a counter-doped layer. For example, a P-type substrate may be counter-doped with N-type dopants, or an N-type substrate may be counter-doped with P-type dopants to form the counter-doped layer. The counter-doped layer prevents porous silicon from forming when the dopants are in a range of $10^{16}$ cm$^{-3}$ P-type to $10^{16}$ cm$^{-3}$ N-type. This range is exemplary only, and other ranges are possible.

An insulator layer 310 (e.g., a buried oxide (BOX) layer) may be deposited on the front-side surface of the semiconductor handle substrate 302. A device semiconductor layer 320 may be deposited over the insulator layer 310. Subsequently, an ion-implantation process may be used to implant ions into the front-side surface of the semiconductor handle substrate 302. The ion-implantation process may also occur at any point prior to depositing the device semiconductor layer 320. The etch stop layer 340 may contact the insulator layer 310. Additionally, there may be a gap between the etch stop layer 340 and the insulator layer 310 of bulk silicon.

According to an aspect of the present disclosure, the SOI device 300 may further include a trap rich layer between the insulator layer 310 and the etch stop layer 340. For example, the trap rich layer may include a combination of an ion-implanted layer and/or a counter-doped layer.

According to additional aspects of the present disclosure, an active device 322 may be fabricated from the device semiconductor layer 320. For example, the active device 322 may include radio frequency (RF) switch devices. A dielectric layer 330 may be deposited over the active device 322 and the insulator layer 310 for protection. The semiconductor handle substrate 302 may then undergo conversion to porous silicon during a chemical etch (e.g., electro-chemical etch in dilute hydrofluoric acid).

For example, a backside of the semiconductor handle substrate 302 may be etched to create the porous silicon layer 360. Different porosities for the porous silicon layer 360 may be determined by controlling a current density, a concentration of the acid, and a duration of the etch. For example, the porous silicon layer 360 may be 20%-60% porous. Additionally, the porous silicon layer 360 may be 200-700 microns thick. The etch stop layer 340 prevents the chemical etch from damaging the active device 322. After conversion to porous silicon, the semiconductor handle substrate 302 may be back grinded for thinning, and a conductive bump 350 may be formed on the dielectric layer 330.

According to an aspect of the present disclosure, the porous silicon layer 360 may be sealed (e.g., high pressure seal) or capped with oxide (e.g., sealed oxide porous silicon), or the pores may include an oxide within them. This would smooth out the semiconductor handle substrate 302 to allow for better bonding.

FIGS. 4A-4D illustrate a fabrication process for a semiconductor on insulator (SOI) device 400, according to aspects of the present disclosure. The SOI device 400 may include a semiconductor handle substrate 402 having an etch stop layer 440.

Figure 4A:
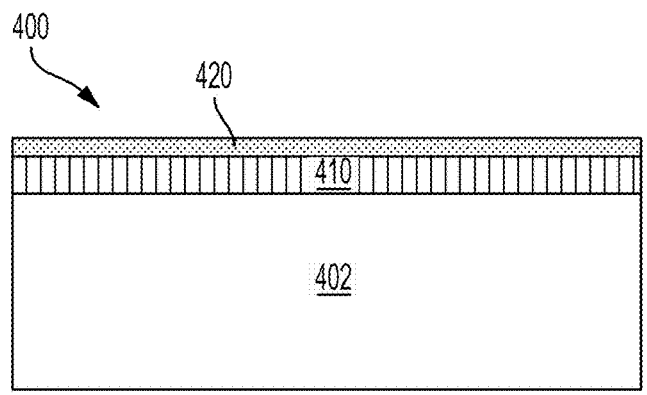
FIGS. 4A-4D illustrate a fabrication process for the semiconductor handle substrate including an etch stop layer of FIG. 4 according to aspects of the present disclosure.

FIG. 4A illustrates the semiconductor handle substrate 402 supporting an insulator layer 410 and a device semiconductor layer 420. The insulator layer 410 may be buried oxide (BOX) layer formed on a front-side of the semiconductor handle substrate 402. The device semiconductor layer 420 may be epitaxially grown on the insulator layer 410.

Figure 4B:
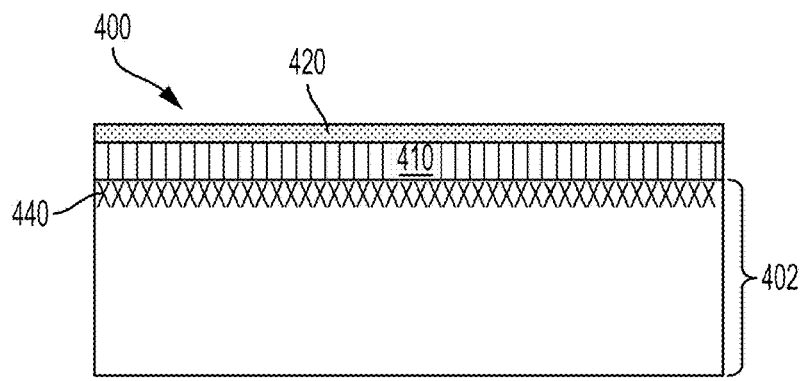

FIG. 4B illustrates the SOI device 400 after ion-implantation of the etch stop layer 440. For example, germanium may be implanted into a front-side surface of the semiconductor handle substrate 402. Alternatively, the etch stop layer 440 may be a counter-doped layer. The etch stop layer 440 may also include a combination of either or both of an ion-implanted layer and/or a counter-doped layer. The counter-doped layer may be formed by either counter-doping a P-type substrate with N-type dopants, or counter-doping an N-type substrate with P-type dopants. For example, the counter-doped layer prevents porous silicon from forming when the dopants are in a range of $10^{16}$ cm$^{-3}$ P-type to $10^{16}$ cm$^{-3}$ N-type. This range is exemplary only, and other ranges are possible.

According to an additional aspect, the etch stop layer 440 may be formed by deposition of either the insulator layer 410 or the device semiconductor layer 420. Additionally, there may be a gap between the etch stop layer 440 and the insulator layer 410 (e.g., a layer of bulk silicon).

According to an aspect of the present disclosure, the SOI device 400 may further include a trap rich layer (not shown) between the insulator layer 410 and the etch stop layer 440. For example, the trap rich layer may be an ion-implanted layer, and/or the etch stop layer 440 may be a counter-doped layer.

Figure 4C:
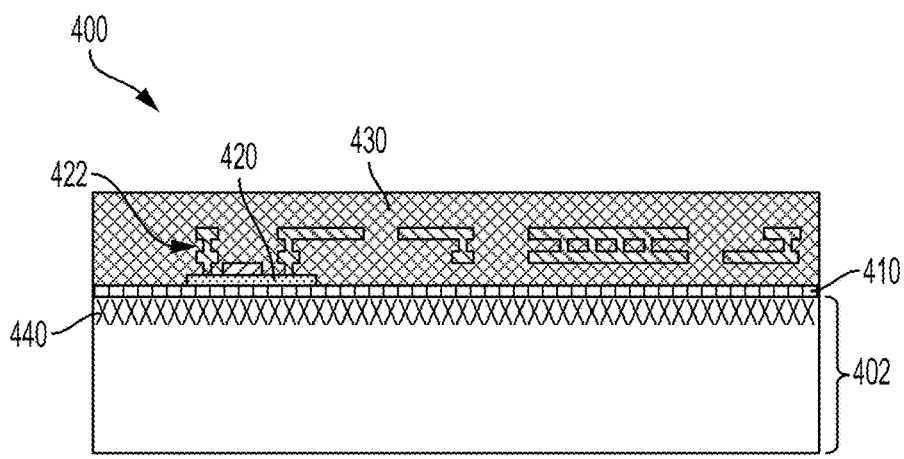
Figure 4D:
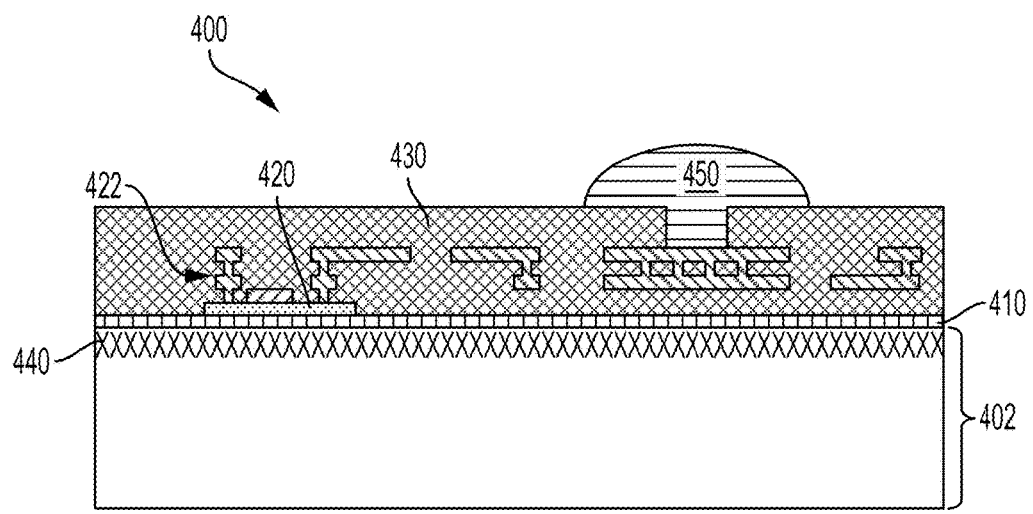

FIG. 4C illustrates fabrication of an active device 422 on the device semiconductor layer 420. For example, the active device 422 may be a transistor (e.g., an RF switch transistor). A dielectric layer 430 may be deposited over the active device 422 and the insulator layer 410 for protection. In this arrangement, the etch stop layer 440 protects the active device 422 during formation of a porous layer with the semiconductor handle substrate 402. FIG. 4D illustrates a conductive bump 450 bonded to the dielectric layer 430.

FIG. 5 illustrates a semiconductor on insulator (SOI) device 500 including an etch stop layer 540 as fabricated according to FIGS. 4A-4D. According to aspects of the present disclosure, a porous semiconductor layer 560 (e.g., a porous silicon layer) may be formed up to the etch stop layer 540 in the semiconductor handle substrate 502. For example, the backside of the semiconductor handle substrate 502 may be exposed to a hydrofluoric (HF) acid etch to form the porous semiconductor layer 560.

According to an aspect of the present disclosure, the porous semiconductor layer 560 may include large pores, medium pores, and small pores. For example, the sizes of the pores may decrease towards the front side of the semiconductor handle substrate 502, and may increase towards the backside of the semiconductor handle substrate 502, thus creating different depths with different porosities. This may be due to the chemical etching inwardly from the backside of the semiconductor handle substrate 502. Because the backside is etched first, and the chemical etch penetrates deeper from the backside, the region between the front side and the backside are affected less, resulting in smaller pores toward the front side.

According to additional aspects of the present disclosure, the porous semiconductor layer 560 may be a porous silicon layer having different porosities. For example, the porous semiconductor layer 560 may be 30% porous, 40% porous, etc. The porosity of a 30% porous silicon layer may be more uniform as compared to a 40% porous silicon layer. This may be due to the chemical etch affecting the backside of the semiconductor handle substrate 502 more evenly at a lower porosity. As the desired porosity increases, the sizes of the pores may vary greater according to their depths in relation to the backside, because the direction of the chemical etch moves inwardly from the backside. The porosity of the porous semiconductor layer 560 may be controlled by a duration of the etch, a concentration of the acid, a current density, etc.

According to an aspect of the present disclosure, performance results for higher porosities indicate that higher porosities may be desired as a trap rich layer. As the porosity increases, so does the variation in sizes of pores. Additionally, if the substrate is too porous (e.g., above 80%), the substrate may become brittle.

According to additional aspects of the present disclosure, the semiconductor handle substrate 502 may be back grinded to thin out the SOI device 500. The back grinding may occur before or after HF etching. Back grinding after etching may be advantageous in that porous silicon is more easily grinded for higher precision thinning.

An advantage of using the semiconductor handle substrate 502 with an etch stop layer 540 is that the etch stop layer 540 prevents damage to the active device 522, while also creating a trap rich layer (TRL) and being relatively inexpensive to manufacture. The porous semiconductor layer 560 also exhibits trap rich layer characteristics. For example, performance comparisons between conventional high resistivity (HR) trap rich layer substrates and porous silicon show that a 30% porous substrate yields at least a 35 dB improvement.

Figure 6:
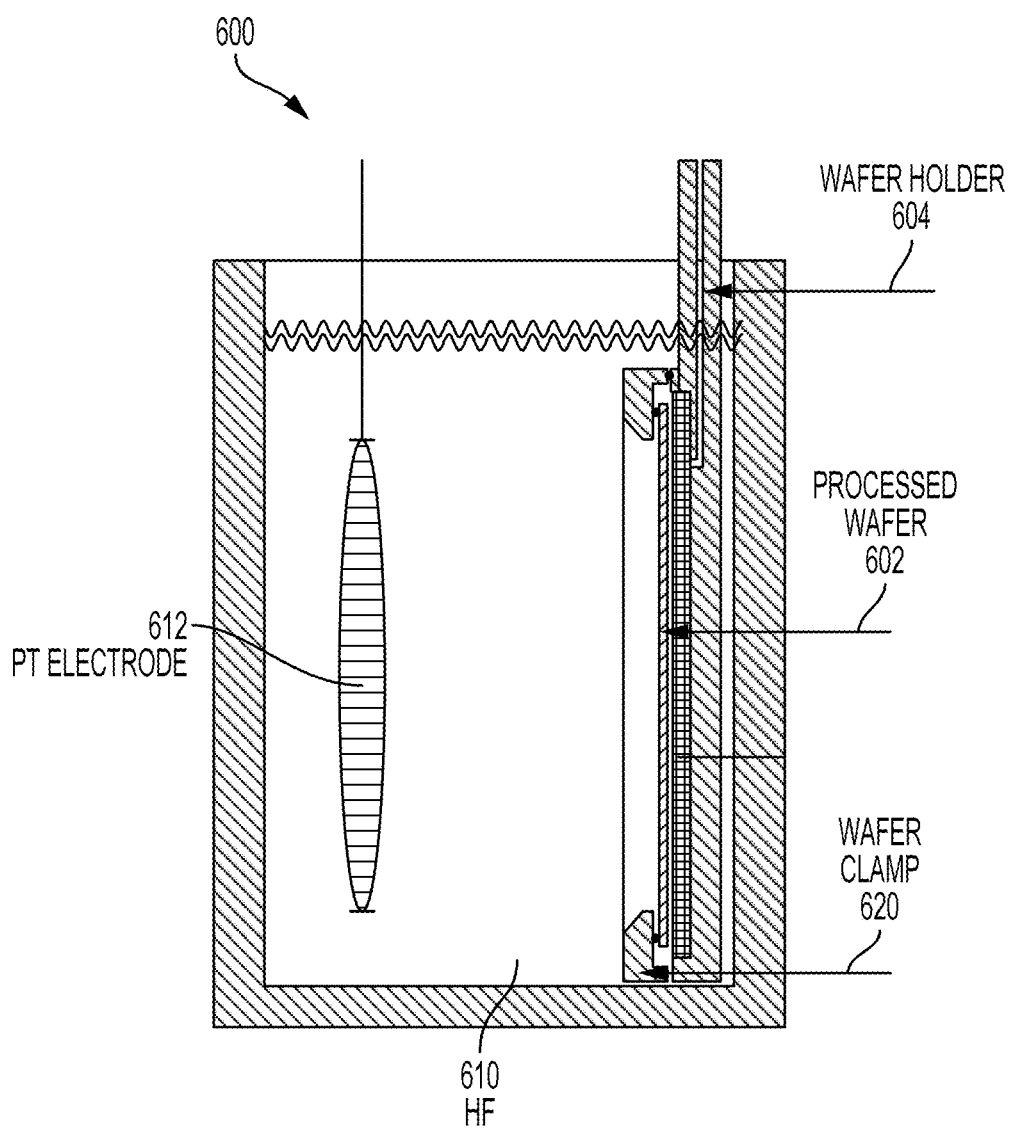
FIG. 6 illustrates an electro-chemical etch process for etching a semiconductor handle substrate including an etch stop layer according to aspects of the present disclosure.

FIG. 6 illustrates an electro-chemical etch 600 for forming porous silicon according to aspects of the present disclosure. A processed wafer 602 (e.g., SOI device) to be etched is held in place in a hydrofluoric bath 610 by a wafer holder 604 and wafer clamp 620. A current is then applied across an electrode 612 (e.g., platinum electrode), which causes the processed wafer 602 to be etched.

A desired degree of porosity for the processed wafer 602 may be controlled by varying a current density, a concentration of the acid, and a duration of the etch. The higher the current density, the acid concentration, and the duration, the higher the etch, which results in higher porosity.

According to aspects of the present disclosure, the electro-chemical etch 600 may only etch a single side of the processed wafer 602. For example, the wafer holder 604 and the wafer clamp 620 only expose a backside of the processed wafer 602. Additionally, the wafer holder 604 and wafer clamp 620 may hold the processed wafer 602 around its circumference, thus creating an un-etched portion around the circumference of the processed wafer 602. The wafer holder 604 and wafer clamp 620 may otherwise be modified to hold the processed wafer 602 while covering portions of the processed wafer 602 not to be etched.

As described, the etch is stopped by an etch stop layer, which protects active devices on the processed wafer 602.

Figure 7:
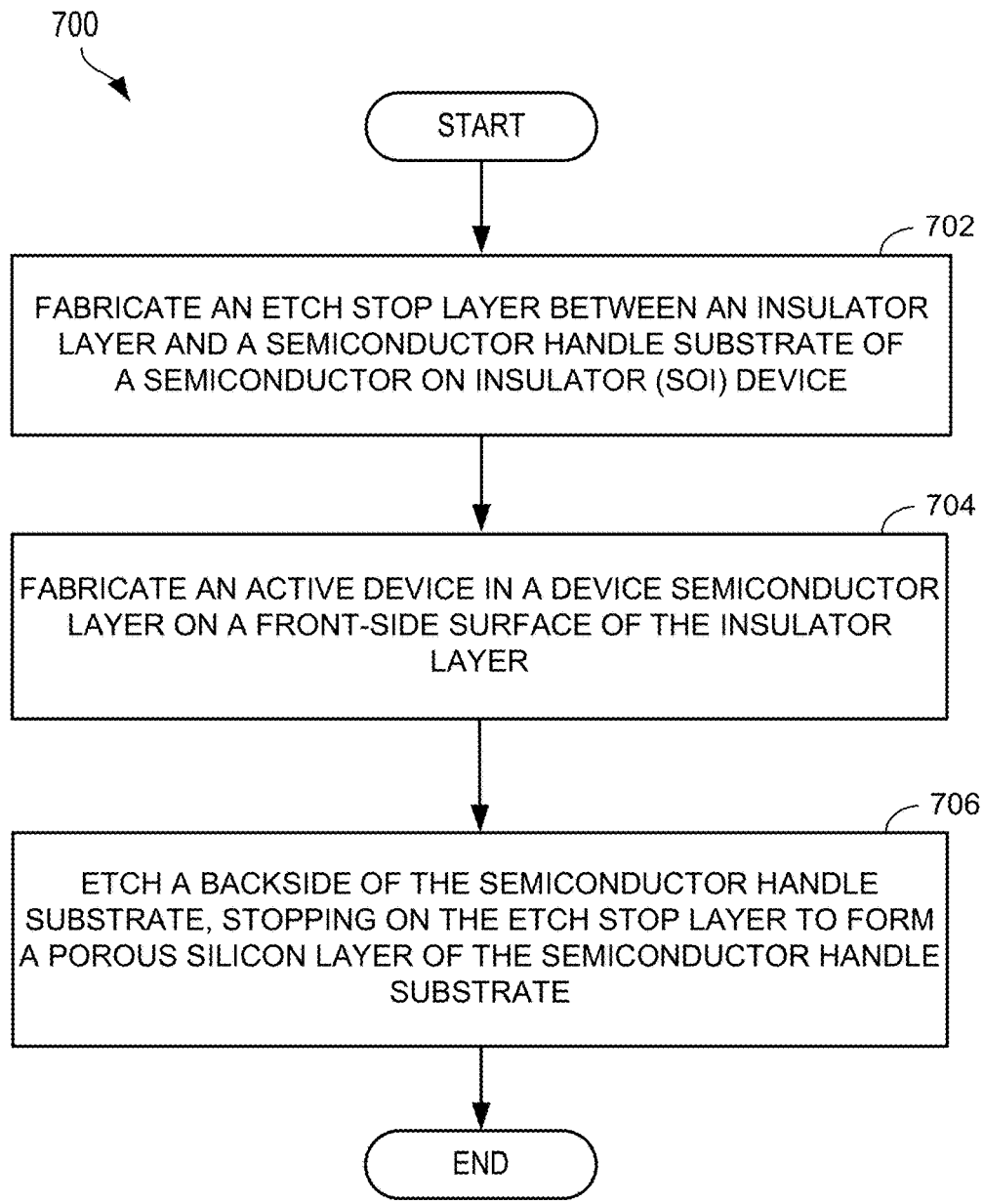
FIG. 7 is a process flow diagram illustrating a method of fabricating a semiconductor on insulator (SOI) device including an etch stop layer according to aspects of the present disclosure.

FIG. 7 is a flow diagram illustrating a method 700 of fabricating a semiconductor on insulator (SOI) device including a semiconductor handle substrate, in accordance with aspects of the present disclosure. The blocks in the method 700 may be performed in or out of the order shown, and in some aspects, can be performed at least in part in parallel.

At block 702, an etch stop layer is fabricated between an insulator layer and a semiconductor handle substrate of an SOI device. For example, as shown in FIG. 4A, the insulator layer 410 is formed on the semiconductor handle substrate 402. As shown in FIG. 4B, the etch stop layer 440 may fabricated by either be implanting germanium, or counter-doping. Formation of the etch stop layer 440 may occur at any point prior to depositing the device semiconductor layer 420. The etch stop layer 440 may contact the insulator layer 410. Additionally, there may be a gap between the etch stop layer 440 and the insulator layer 410.

According to an aspect of the present disclosure, a trap rich layer may be formed between the insulator layer 410 and the etch stop layer 440. For example, the trap rich layer may be an ion-implanted layer, and/or the etch stop layer 440 may be a counter-doped layer. In this example, the etch stop material is implanted into a front-side of the semiconductor handle substrate 402 proximate the insulator layer 410.

Referring again to FIG. 7, at block 704, an active device is fabricated in a device semiconductor layer on a front-side surface of the insulator layer. For example, as shown in FIG. 4A, the insulator layer 410 is formed on the semiconductor handle substrate 402. In addition, the device semiconductor layer 420 on the insulator layer 410 enables formation of an active device 422. At block 706, a backside of the semiconductor handle substrate is etched. Etching of the backside of the semiconductor handle substrate stops on the etch stop layer to form a porous silicon layer of the semiconductor handle substrate.

For example, as shown in FIGS. 4D and 5, the semiconductor handle substrate 402 (e.g., processed wafer 502) may be exposed to a hydrofluoric acid etch (e.g., a single cell, electrolyzing bath of hydrofluoric acid) to etch a backside of the semiconductor handle substrate 402 (e.g., processed wafer 502). A porous layer (e.g., the porous semiconductor layer 560) may thus be formed. The etch stop layer 440 prevents the acid etch from damaging the device semiconductor layer 420.

In an aspect of the present disclosure, a porosity of the porous semiconductor layer 460 may vary (e.g., from 20%-60% porous). For example, a porosity may vary at different layers of depth or surface regions of the semiconductor handle substrate 402. Additionally, the porous semiconductor layer 460 may be capped or sealed with oxide.

Various aspects of the present disclosure provide techniques for forming an etch stop layer that also functions as a trap rich layer (TRL) on a top surface of a bulk semiconductor handle wafer. The etch stop layer reduces harmonics of an RF device and increases linearity significantly relative to current techniques. For example, a circuit may be fabricated on a wafer (e.g., a CMOS wafer) having the etch stop layer for improving second and third order harmonics.

Porous silicon may be cheaply fabricated by introducing a silicon wafer to an electro-chemical etch in dilute hydrofluoric acid. For example, a bulk semiconductor wafer may be subjected to an electro-chemical etch process to form porous silicon within a surface of the bulk semiconductor wafer. The depth of the etch is controlled by an etch stop layer. The degree of porosity of the porous silicon may be controlled by a current density, a concentration of the acid, and a duration of the etch. Cost may be reduced by forming the etch stop layer on a bulk semiconductor handle wafer, rather than using a conventional, trap rich silicon handle wafer. The etch stop layer functions as a trap rich layer without using a conventional trap rich silicon handle wafer, which is twice the cost of a bulk silicon wafer.

According to a further aspect of the present disclosure, a semiconductor on insulator (SOI) device is described. The SOI device may include an insulator layer having a backside surface on a semiconductor handle substrate. The SOI device may also include a device semiconductor layer on a front-side surface of the insulator layer. The semiconductor handle substrate also includes an etch stop layer proximate the insulator layer. In this arrangement, the semiconductor handle substrate further includes means for reducing radio frequency (RF) harmonics contacting the etch stop layer. The means for reducing may be, for example, the porous semiconductor layer 560, as shown in FIG. 5. In another aspect, the aforementioned means may be any layer, module, or any apparatus configured to perform the functions recited by the aforementioned means.

FIG. 8 is a schematic diagram of a radio frequency (RF) front end (RFFE) module 800 employing RF chips including semiconductor handle substrates having an etch stop layer according to an aspect of the present disclosure. The RF front end module 800 includes power amplifiers 802, duplexer/filters 804, and a radio frequency (RF) switch module 806. The power amplifiers 802 amplify signal(s) to a certain power level for transmission. The duplexer/filters 804 filter the input/output signals according to a variety of different parameters, including frequency, insertion loss, rejection or other like parameters. In addition, the RF switch module 806 may select certain portions of the input signals to pass on to the rest of the RF front end module 800.

The RF front end module 800 also includes tuner circuitry 812 (e.g., first tuner circuitry 812A and second tuner circuitry 812B), a diplexer 819, a capacitor 816, an inductor 818, a ground terminal 815 and an antenna 814. The tuner circuitry 812 (e.g., the first tuner circuitry 812A and the second tuner circuitry 812B) includes components such as a tuner, a portable data entry terminal (PDET), and a house keeping analog to digital converter (HKADC). The tuner circuitry 812 may perform impedance tuning (e.g., a voltage standing wave ratio (VSWR) optimization) for the antenna 814. The RF front end module 800 also includes a passive combiner 808 coupled to a wireless transceiver (WTR) 820. The passive combiner 808 combines the detected power from the first tuner circuitry 812A and the second tuner circuitry 812B. The wireless transceiver 820 processes the information from the passive combiner 808 and provides this information to a modem 830 (e.g., a mobile station modem (MSM)). The modem 830 provides a digital signal to an application processor (AP) 840.

As shown in FIG. 8, the diplexer 819 is between the tuner component of the tuner circuitry 812 and the capacitor 816, the inductor 818, and the antenna 814. The diplexer 819 may be placed between the antenna 814 and the tuner circuitry 812 to provide high system performance from the RF front end module 800 to a chipset including the wireless transceiver 820, the modem 830 and the application processor 840. The diplexer 819 also performs frequency domain multiplexing on both high band frequencies and low band frequencies. After the diplexer 819 performs its frequency multiplexing functions on the input signals, the output of the diplexer 819 is fed to an optional LC (inductor/capacitor) network including the capacitor 816 and the inductor 818. The LC network may provide extra impedance matching components for the antenna 814, when desired. Then a signal with the particular frequency is transmitted or received by the antenna 814. Although a single capacitor and inductor are shown, multiple components are also contemplated.

FIG. 9 is a schematic diagram 900 of a WiFi module 970 including a first diplexer 990-1 and an RF front end module 950 including a second diplexer 990-2 for a chipset 960 including RF chips having semiconductor handle substrates including an etch stop layer according to aspects of the present disclosure. The WiFi module 970 includes the first diplexer 990-1 communicably coupling an antenna 992 to a wireless local area network module (e.g., WLAN module 972). The RF front end module 950 includes the second diplexer 990-2 communicably coupling an antenna 994 to the wireless transceiver (WTR) 920 through a duplexer 980. The wireless transceiver 920 and the WLAN module 972 of the WiFi module 970 are coupled to a modem (MSM, e.g., baseband modem) 930 that is powered by a power supply 952 through a power management integrated circuit (PMIC) 956. The chipset 960 also includes capacitors 962 and 964, as well as an inductor(s) 966 to provide signal integrity. The PMIC 956, the modem 930, the wireless transceiver 920, and the WLAN module 972 each include capacitors (e.g., 958, 932, 922, and 974) and operate according to a clock 954. The geometry and arrangement of the various inductor and capacitor components in the chipset 960 may reduce the electromagnetic coupling between the components.

Figure 10:
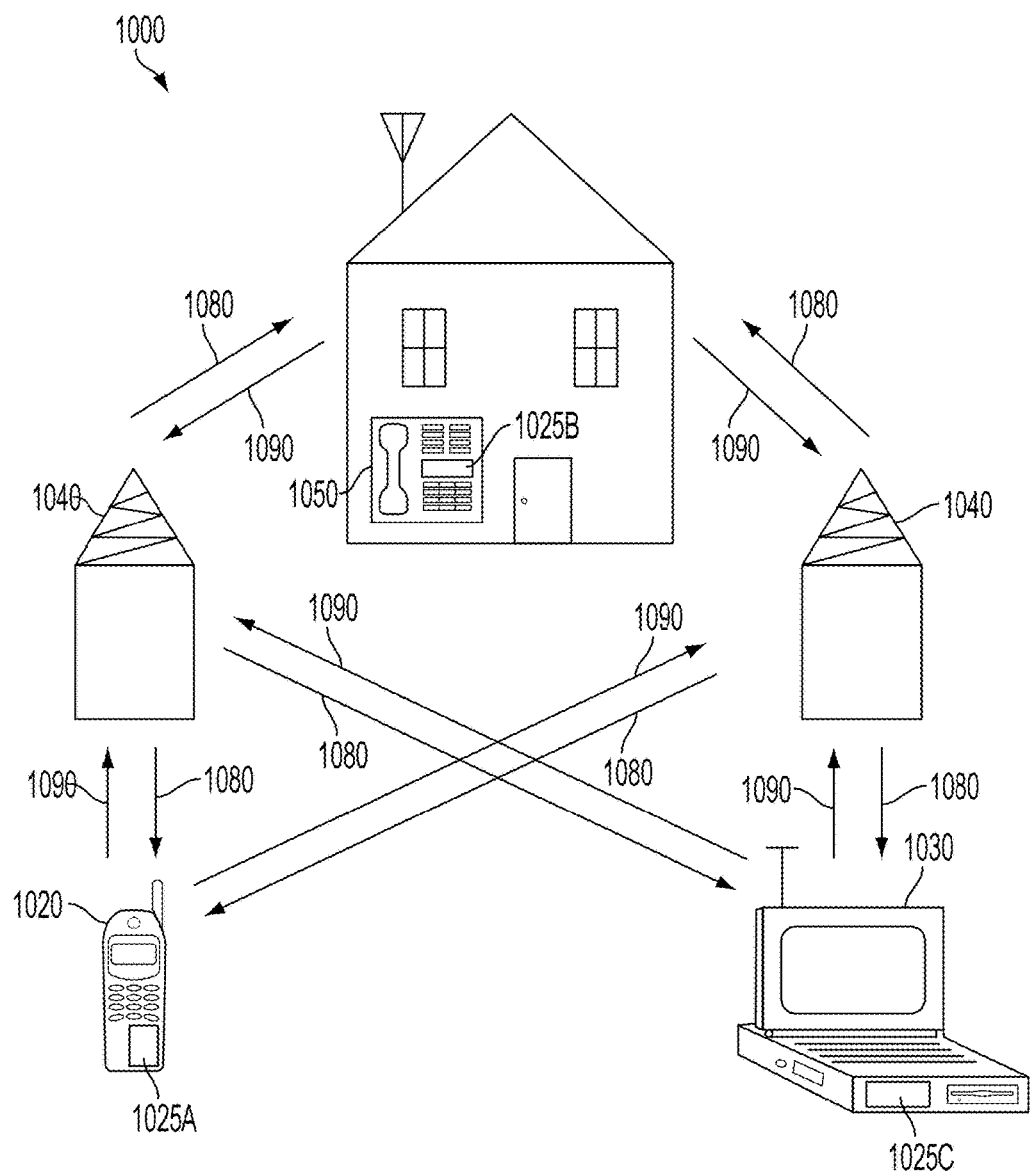
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed semiconductor handle substrates having an etch stop layer. It will be recognized that other devices may also include the disclosed handle substrates having an etch stop layer for forming a porous silicon layer, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed handle substrates having an etch stop layer for forming a porous silicon layer.

Figure 11:
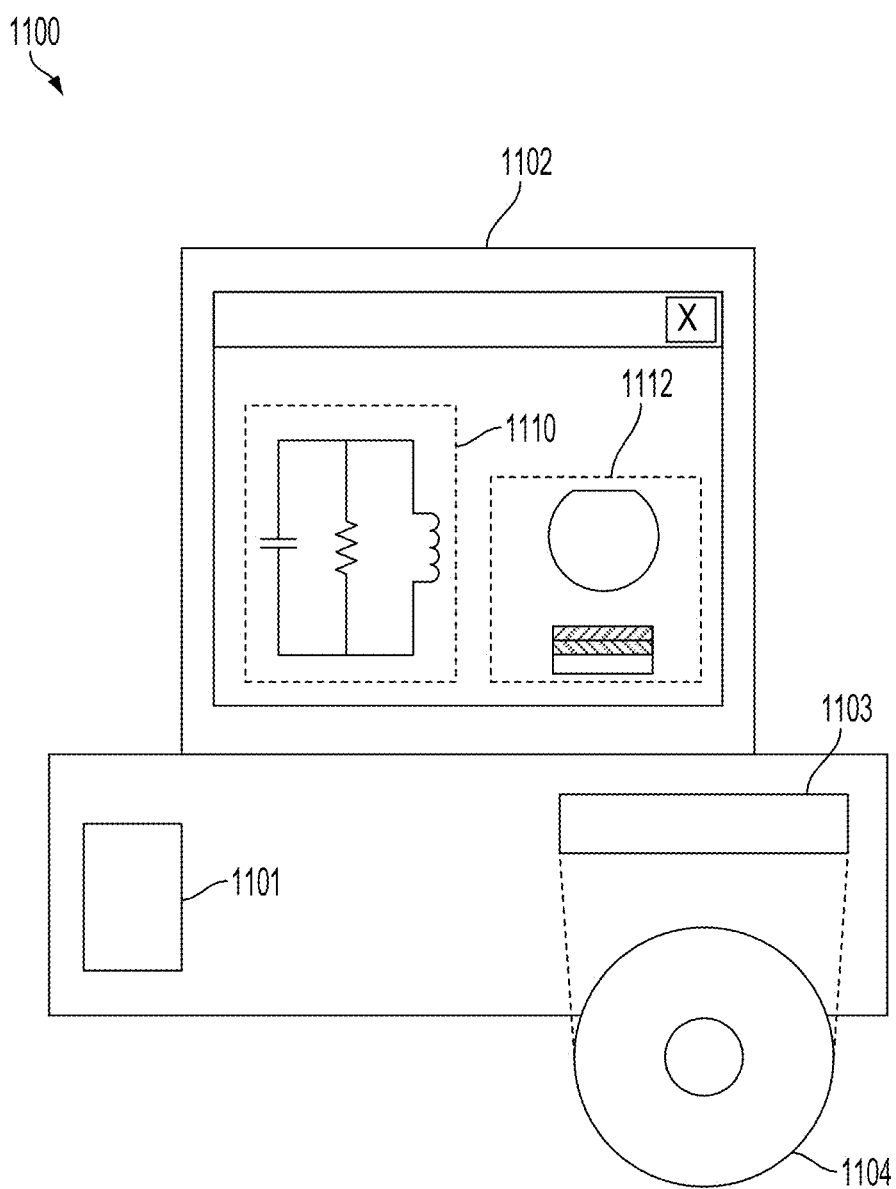
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the semiconductor handle substrates having an etch stop layer disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112, such as a handle substrate having an etch stop layer for forming a porous silicon layer. A storage medium 1104 is provided for tangibly storing the circuit design 1110 or the semiconductor component 1112. The circuit design 1110 or the semiconductor component 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component 1112 by decreasing the number of processes for designing semiconductor wafers.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The apparatuses, methods, and systems disclosed herein may also be implemented digitally and differentially, among others. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described herein may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A semiconductor on insulator (SOI) device, comprising:
    a semiconductor handle substrate comprising a porous semiconductor layer, and an etch stop layer proximate the porous semiconductor layer;
    an insulator layer on the etch stop layer;
    a bulk semiconductor layer between the insulator layer and the etch stop layer; and
    a device semiconductor layer on the insulator layer.

2. The device of claim 1, in which the etch stop layer comprises implanted germanium.

3. The device of claim 1, in which the etch stop layer comprises a trap rich layer.

4. The device of claim 1, in which the device semiconductor layer comprises radio frequency (RF) switch devices.

5. The device of claim 1, in which the etch stop layer comprises a counter-doped layer.

6. The device of claim 5, further comprising a trap rich layer as the bulk semiconductor layer between the insulator layer and the counter-doped layer.

7. The device of claim 1, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

8. A semiconductor on insulator (SOI) device, comprising:
    an insulator layer having a backside surface on a semiconductor handle substrate;
    a device semiconductor layer on a front-side surface of the insulator layer; and
    the semiconductor handle substrate including an etch stop layer proximate the insulator layer and a bulk semiconductor layer between the insulator layer and the etch stop layer, the semiconductor handle substrate comprising means for reducing radio frequency (RF) harmonics contacting the etch stop layer.

9. The device of claim 8, in which the etch stop layer comprises implanted germanium.

10. The device of claim 8, in which the etch stop layer comprises a trap rich layer.

11. The device of claim 8, in which the device semiconductor layer comprises radio frequency (RF) switch devices.

12. The device of claim 8, in which the etch stop layer comprises a counter-doped layer.

13. The device of claim 8, integrated into an RF front end module, the RF front end module incorporated into at least one of a music player, a video player, an entertainment unit, a navigation device, a communications device, a personal digital assistant (PDA), a fixed location data unit, a mobile phone, and a portable computer.

* * * * *